(12) United States Patent
Chung et al.

(10) Patent No.: US 7,902,085 B2
(45) Date of Patent: Mar. 8, 2011

(54) DROPLET EJECTING APPARATUS, METHOD OF FORMING A THIN FILM, AND SUBSTRATE FOR A DISPLAY DEVICE

(75) Inventors: Jin-Koo Chung, Suwon-si (KR); Kyu-Ha Chung, Seoul (KR); Joon-Hoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 611 days.

(21) Appl. No.: 11/349,406

(22) Filed: Feb. 7, 2006

(65) Prior Publication Data

US 2006/0176335 A1   Aug. 10, 2006

(30) Foreign Application Priority Data

Feb. 7, 2005   (KR) ................ 10-2005-0011285

(51) Int. Cl.
*H01L 21/31* (2006.01)
*H01L 21/469* (2006.01)
(52) U.S. Cl. ............... 438/780; 257/E21.002; 347/33
(58) Field of Classification Search ........... 438/22
See application file for complete search history.

(56) References Cited

U.S. PATENT DOCUMENTS

| | | | |
|---|---|---|---|
| 6,145,960 A * | 11/2000 | Kanda et al. | 347/41 |
| 6,364,450 B1 * | 4/2002 | Yamaguchi et al. | 347/33 |
| 6,806,925 B2 * | 10/2004 | Ishii et al. | 349/106 |
| 2002/0054252 A1 * | 5/2002 | Ishii et al. | 349/106 |
| 2002/0186277 A1 * | 12/2002 | Kanda et al. | 347/43 |
| 2004/0021413 A1 * | 2/2004 | Ito et al. | 313/504 |
| 2004/0115339 A1 * | 6/2004 | Ito | 427/66 |
| 2005/0094061 A1 * | 5/2005 | Lee et al. | 349/106 |
| 2005/0163938 A1 * | 7/2005 | Yamazaki et al. | 427/554 |

FOREIGN PATENT DOCUMENTS

JP   2001-228320 A   8/2001
JP   2003-159787 A   6/2003

* cited by examiner

*Primary Examiner* — Jarrett J Stark
(74) *Attorney, Agent, or Firm* — Cantor Colburn LLP

(57) ABSTRACT

A droplet ejecting apparatus, method of forming a thin film, and a substrate for a display device, wherein a droplet ejecting apparatus includes a first ejecting unit ejecting a first droplet on a substrate, a second ejecting unit ejecting a second droplet on the substrate along a path defined by a movement of the first ejecting unit, and a transporting unit connected with the first ejecting unit and the second ejecting unit to transport the first ejecting unit and the second ejecting unit.

15 Claims, 18 Drawing Sheets

DROPLET EJECTING APPARATUS, METHOD OF FORMING A THIN FILM, AND SUBSTRATE FOR A DISPLAY DEVICE

CROSS-REFERENCE OF RELATED APPLICATION

The present application claims priority from Korean Patent Application No. 2005-11285, filed on Feb. 2, 2005, which is hereby incorporated by reference for all purposes as if fully set forth herein.

BACKGROUND OF THE INVENTION

1. Field of the Invention

The present invention relates to a droplet ejecting apparatus, a method of dropping a droplet, a method of forming a thin film pattern, and a substrate for a display device. More particularly, the present invention relates to a droplet ejecting apparatus that improves an image display quality, a method of dropping a droplet, and a method of forming a thin film pattern, and a substrate for a display device.

2. Description of the Related Art

A display device is an interface device converting data that is processed by an information processing device into an image.

The display device includes a flat panel display device, such as a liquid crystal display device (LCD), an organic light emitting display device (OLED), a plasma display panel (PDP), or the like.

The flat panel display devices have thin film patterns, which include thin film transistors (TFTs), gate lines, data lines, pixel electrode, black matrix, color filter, common electrode, etc.

The thin film patterns are formed through complex and time-consuming processes, such as a deposition process, a photolithography process, an etching process, a rinsing process, etc. Therefore, a more efficient fabrication process is needed to form the thin film patterns.

SUMMARY OF THE INVENTION

The present invention provides a droplet ejecting apparatus that improves an image display quality of a display device. Additional features of the invention will be set forth in the description which follows, and in part will be apparent from the description, or may be learned by practice of the invention.

The present invention discloses a droplet ejecting apparatus, including a first ejecting unit ejecting a first droplet on a substrate, a second ejecting unit ejecting a second droplet on the substrate along a path defined by a movement of the first ejecting unit, and a transporting unit connected with the first ejecting unit and the second ejecting unit to transport the first ejecting unit and the second ejecting unit.

The present invention also discloses a method of dropping a droplet on a substrate, including disposing first droplets on the substrate along a path, and disposing second droplets in a path region of the substrate that is adjacent to the path, wherein each of the second droplets is disposed between the first droplets.

The present invention also discloses a method of forming a thin film pattern on a substrate including disposing first droplets on a portion of recesses that are arranged substantially parallel with one another on the substrate, disposing second droplets on another portion of the recesses, and drying the first droplets and the second droplets to form thin film patterns, wherein each of the second droplets is disposed between the first droplets.

The present invention also discloses a method of forming a thin film pattern on a substrate, including disposing a first droplet on each of a plurality of recesses that arranged substantially parallel with one another on the substrate, disposing a second droplet on each of the recesses, and drying the first and second droplets to form thin film patterns on the recesses of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention

DESCRIPTION OF THE ILLUSTRATED EMBODIMENTS

It should be understood that the exemplary embodiments of the present invention described below may be varied modified without departing from the inventive principles disclosed herein, and the scope of the invention is therefore not limited to the following embodiments. Rather, the embodiments are provided to fully disclose and convey the concept of the invention to those skilled in the art by way of example and not of limitation.

Hereinafter, the present invention is described with reference to the accompanying drawings.

Figure 1:
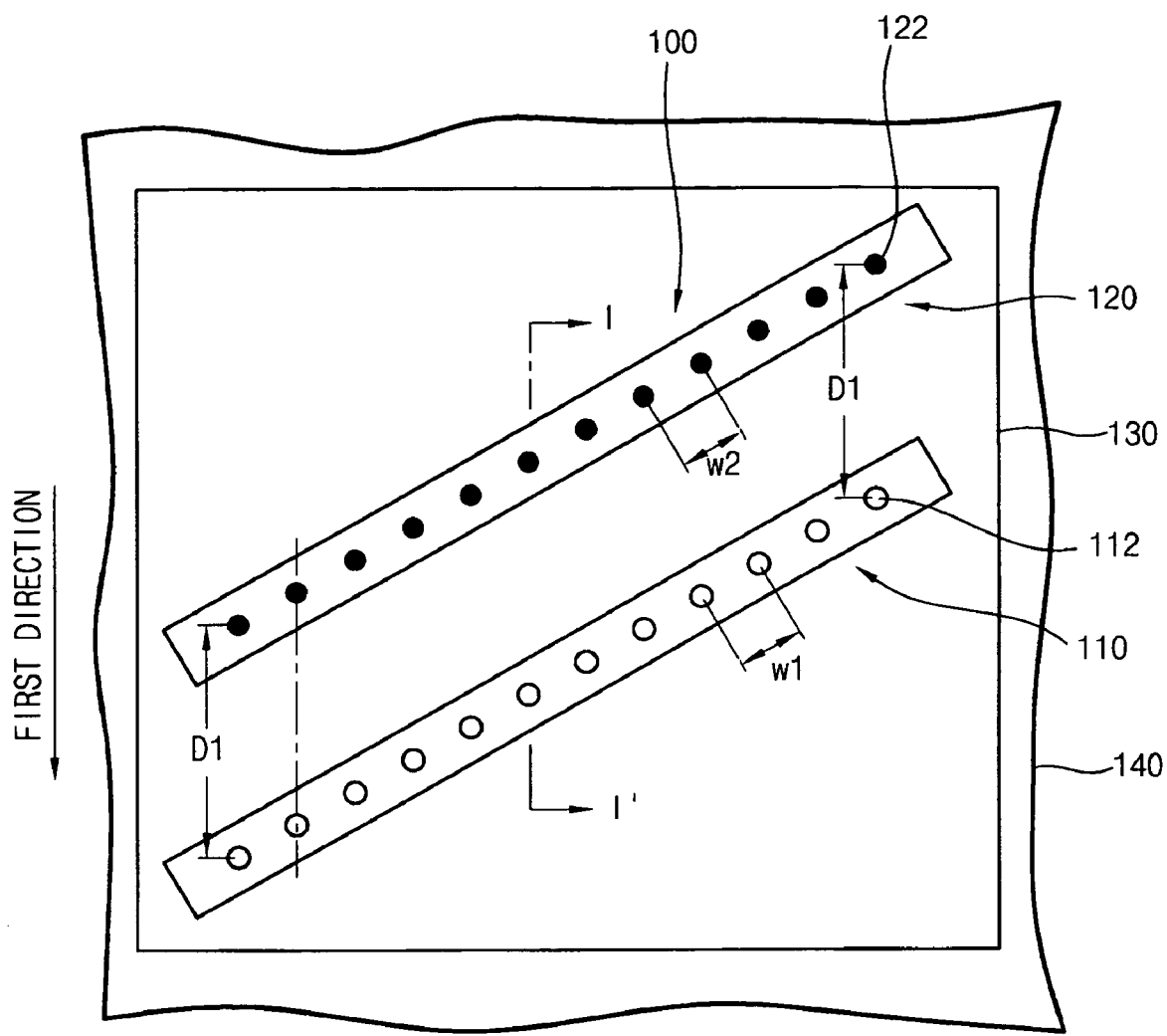
FIG. 1 is a plan view showing a droplet ejecting apparatus according to an embodiment of the inventions.
Figure 2:
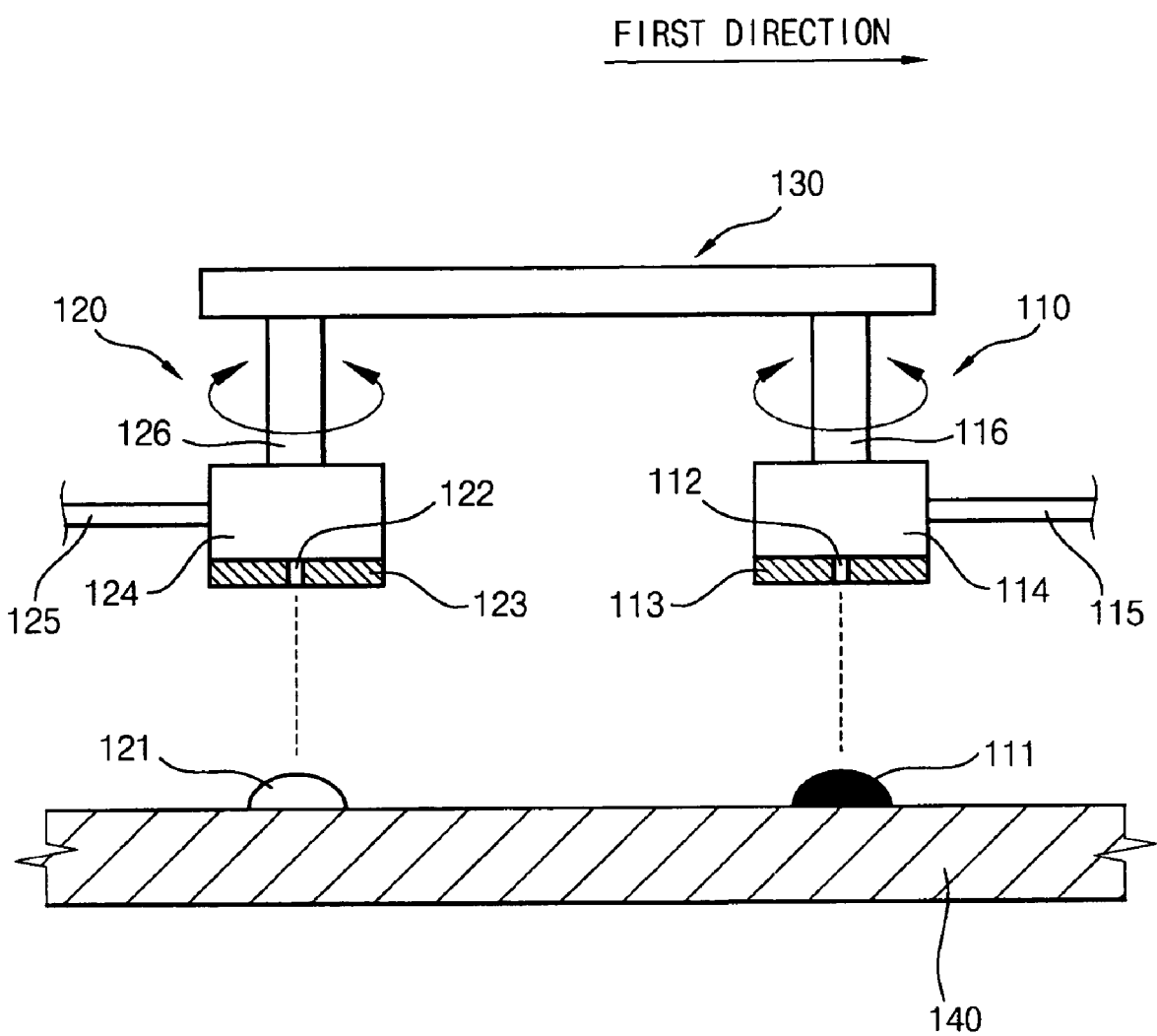
FIG. 2 is a cross-sectional view taken along a line I-I' shown in FIG. 1.

FIG. 1 is a plan view showing a droplet ejecting apparatus according to an embodiment of the invention. FIG. 2 is a cross-sectional view taken along a line I-I' shown in FIG. 1.

Referring to FIG. 1 and FIG. 2, the droplet ejecting apparatus 100 includes a first ejecting unit 110, a second ejecting unit 120, and a transporting unit 130. The first ejecting unit 110 ejects first droplets 111 on a substrate 140. The second ejecting unit 120 ejects second droplets 121 on the substrate 140.

The transporting unit 130 transports the first ejecting unit 110 and the second ejecting unit 120, which are each connected with the transporting unit 130.

The first ejecting unit 110 is substantially parallel with the second ejecting unit 120. The transporting unit 130 pivots with the first ejecting unit 110 and the second ejecting unit 120 and rotates the fist and second ejecting units 110 and 120 with respect to a first pivot 116 between the transporting unit 130 and the first ejecting unit 110, and a second pivot 126 between the transporting unit 130 and the second ejecting unit 120. According to the embodiment of the invention shown in FIG. 2, rotational angles of the first and second ejecting units 110 and 120 are substantially the same.

The first ejecting unit 110 includes a first ejecting body 113 and a first actuator 114.

The first ejecting body 113 may have a rectangular plate shape, as shown in FIG. 2; however, the shape is not limited thereto. A plurality of first nozzles 112 are formed on the first ejecting body 113. For example, each of the first nozzles 112 includes a through hole formed on the first ejecting body 113. The first nozzles 112 adjacent to each other are spaced apart from each other by a first distance W1, as shown in FIG. 1.

The first actuator 114 ejects liquids on the substrate 140 through the first nozzles 112 of the first ejecting body 113. The first actuator 114 includes a first conduit 115 for the first actuator 114 to receive liquid.

The second ejecting unit 120 includes a second ejecting body 123 and a second actuator 124.

The second ejecting body 123 may have a rectangular plate shape, as shown in FIG. 2; however, the shape is not limited thereto. A plurality of second nozzles 122 are formed on the second ejecting body 123. For example, each of the second nozzles 122 includes a through hole formed on the second ejecting body 123. The second nozzles 122 adjacent to each other are spaced apart from each other by a second distance W2. The second distance W2 may be substantially equal to the first distance W1; however, the invention is not limited thereto.

The second actuator 124 ejects liquids on the substrate 140 through the second nozzles 122 of the second ejecting body 123. The second actuator 124 includes a second conduit 125 for second actuator 124 to receive liquid.

The position of the first nozzles 112 corresponds with the position of the second nozzles 122. Each of the first nozzles 112 is spaced apart from each of the second nozzles 122 by a first distance D1.

Figure 3:
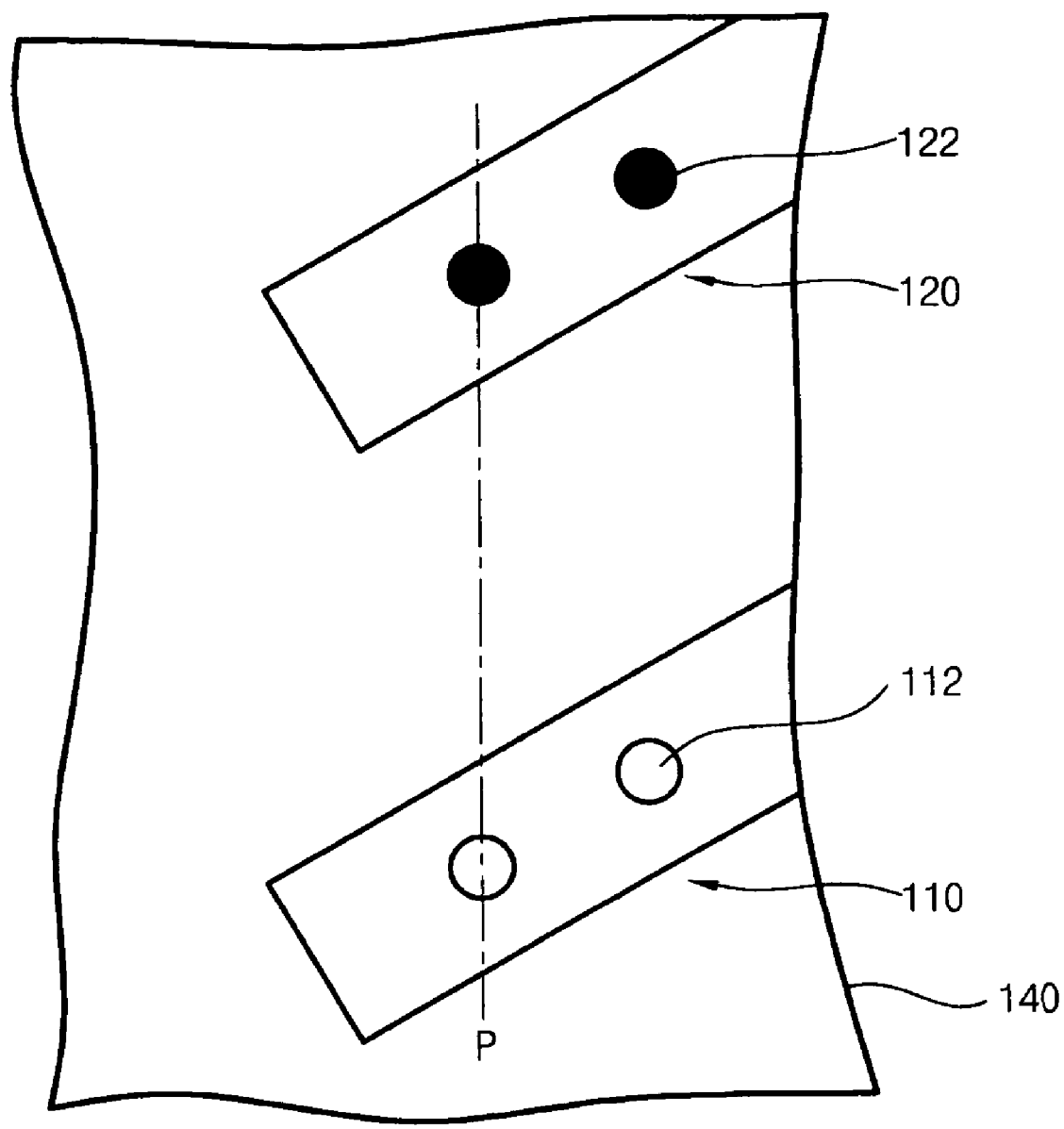
FIG. 3 is a plan view showing a first ejecting unit and a second ejecting unit according to an embodiment of the invention.
Figure 4A:
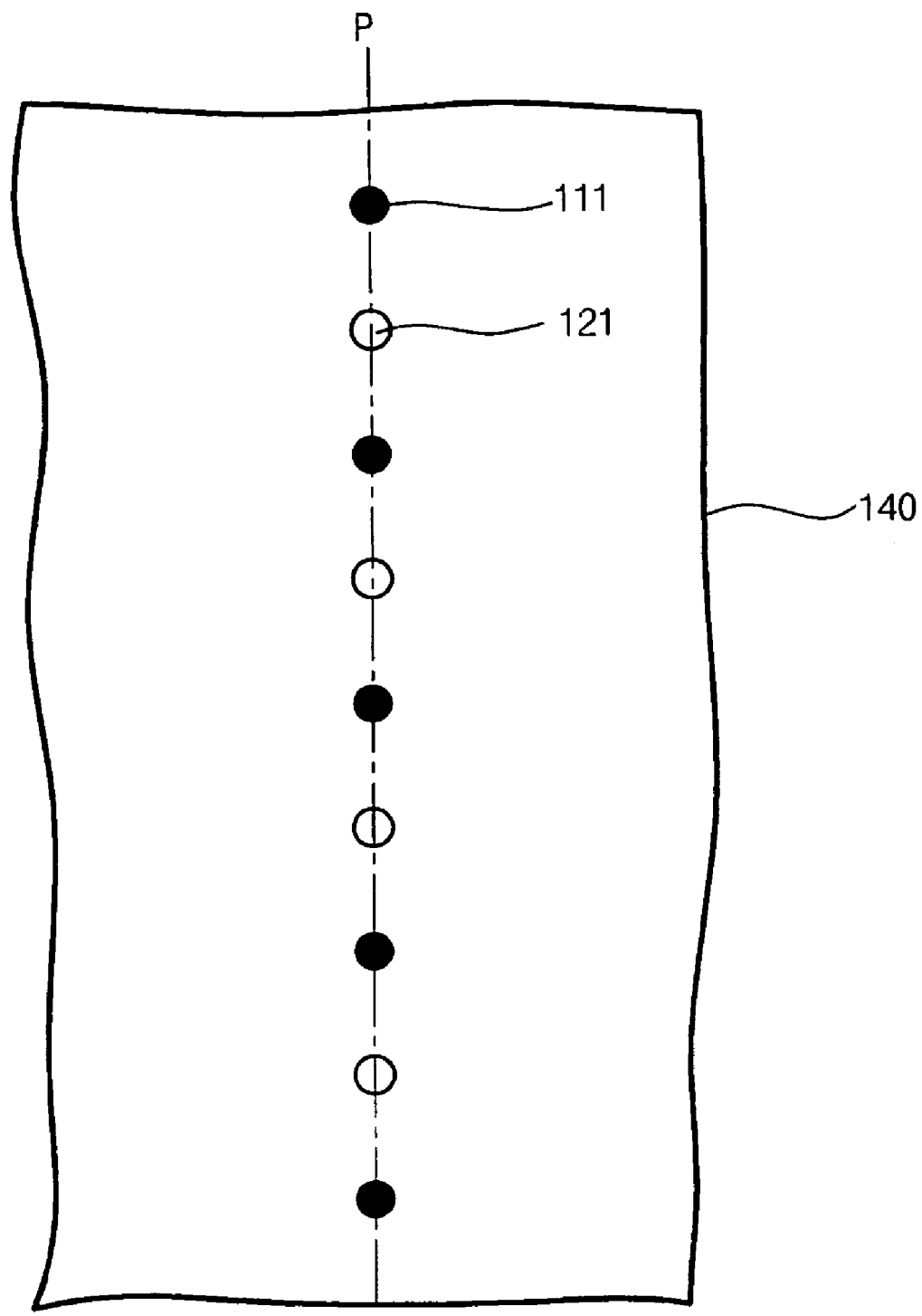
FIGS. 4A, 4B, and 4C are plan views showing first and second droplets formed by the first and second ejecting units shown in FIG. 3.
Figure 4B:
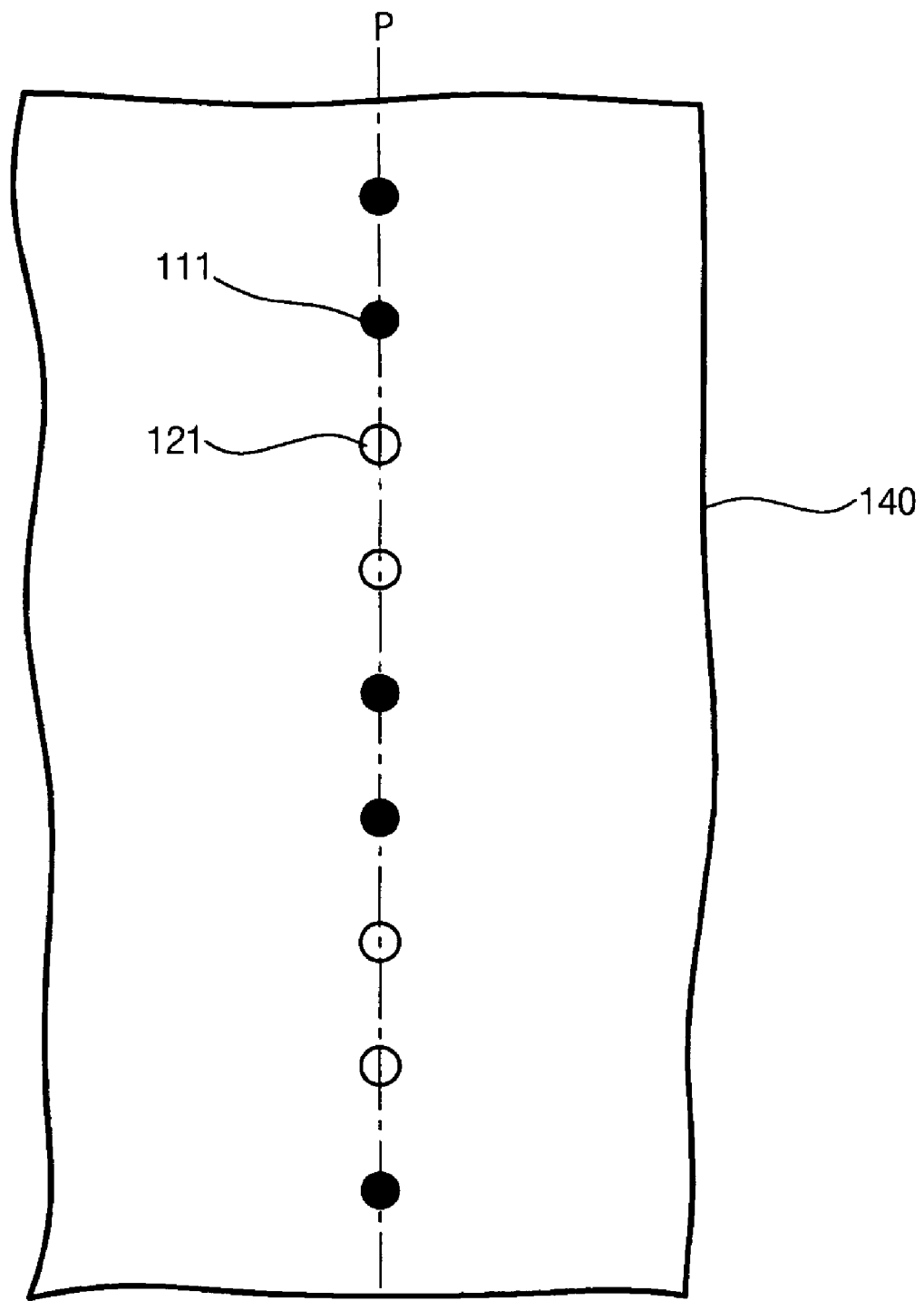
Figure 4C:
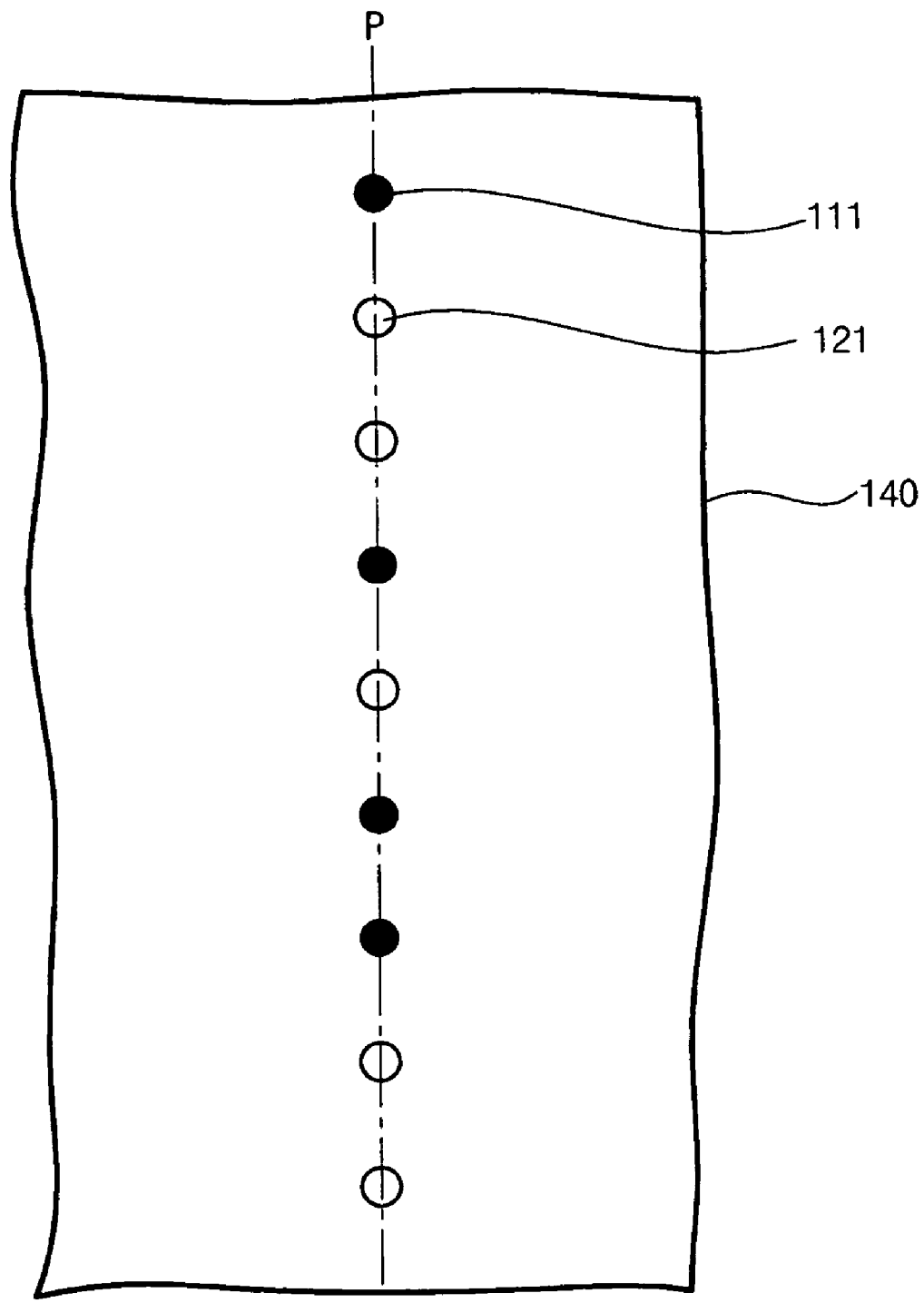

FIG. 3 is a plan view showing a first ejecting unit and a second ejecting unit according to an embodiment of the invention. FIGS. 4A, 4B, and 4C are plan views showing first droplets 112 and second droplets 121 formed by the first etching unit and the second ejecting unit, respectively, shown in FIG. 3.

Referring to FIG. 3, the second nozzles of the second ejecting body 123 are aligned with the first nozzles 112 of the first ejecting body 113. For example, as shown in FIG. 3, each of the second nozzles 122 is provided along a path P defined by each of the first nozzles 112, or vice-versa. The path P is a trace of each of the first nozzles 112 transported by the transporting unit 130.

When each of the second nozzles 122 is located along the path that is defined by each of the first nozzles 112, then each of the first droplets 111 and each of the second droplets 121 are located along the path P.

Referring to FIG. 2 and FIG. 4A, the first droplets 111 ejected through each of the first nozzles 112 and the second droplets 121 ejected through each of the second nozzles 122 are provided along the path P. According to the embodiment of the invention discussed above and shown in FIG. 2 and FIG. 4A, the first and second droplets 111 and 121 are alternately disposed along the path P.

Referring to FIG. 2 and FIG. 4B, the first droplets 111 and the second droplets 121 are ejected through the first nozzles 112 and the second nozzles 122, respectively, along the path P. For example, the first actuator 114 aligns the first droplets 111 ejected through each of the first nozzles 112 along the path P, and at least two of the first droplets ejected through each of the first nozzles 112 are adjacent to each other. The second actuator 124 aligns the second droplets 121 ejected through each of the second nozzles 122 along the path P, and at least two of the second droplets ejected through each of the second nozzles 122 are adjacent to each other. According to an embodiment of the invention, the number of the first droplets 111 adjacent to each other is substantially equal to the number of the second droplets 121 adjacent to each other. Further, the first droplets 111 adjacent to each other and the second droplets 121 adjacent to each other may be alternately disposed along the path P.

Referring to FIG. 2 and FIG. 4C, the first droplets 111 and the second droplets 121 are randomly disposed on the path P. For example, the first actuator 114 may align the first droplets 111 on the path P. One of the first droplets 111 ejected may be disposed between the second droplets 121 ejected through each of the second nozzles 122, or multiple first droplets 111 may be adjacent to each other.

The second actuator 124 aligns the second droplets 121 ejected through each of the second nozzles 122 on the path P. One of the second droplets 121 ejected through each of the second nozzles 122 may be between the first droplets 111 ejected through each of the first nozzles 112, or multiple second droplets 121 may be adjacent to each other. The number of the first droplets 111 adjacent to each other may be different from the number of the second droplets is 121 adjacent to each other. At least one of the first droplets 111 adjacent to each other and at least one of the second droplets 121 adjacent to each other may be alternately disposed along the path P.

Figure 5:
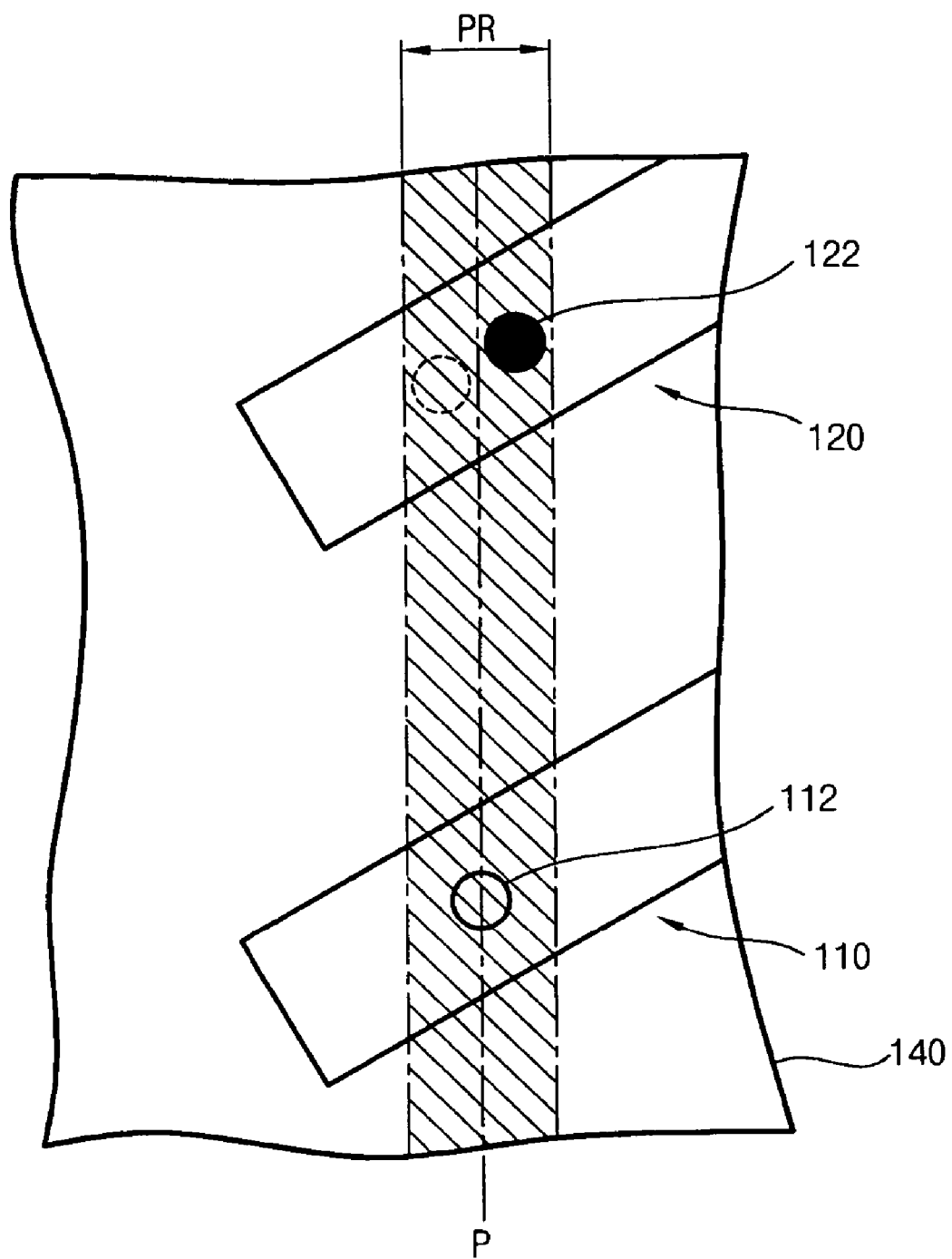
FIG. 5 is a plan view showing a first ejecting unit and a second ejecting unit according to an embodiment of the inventions.
Figure 6A:
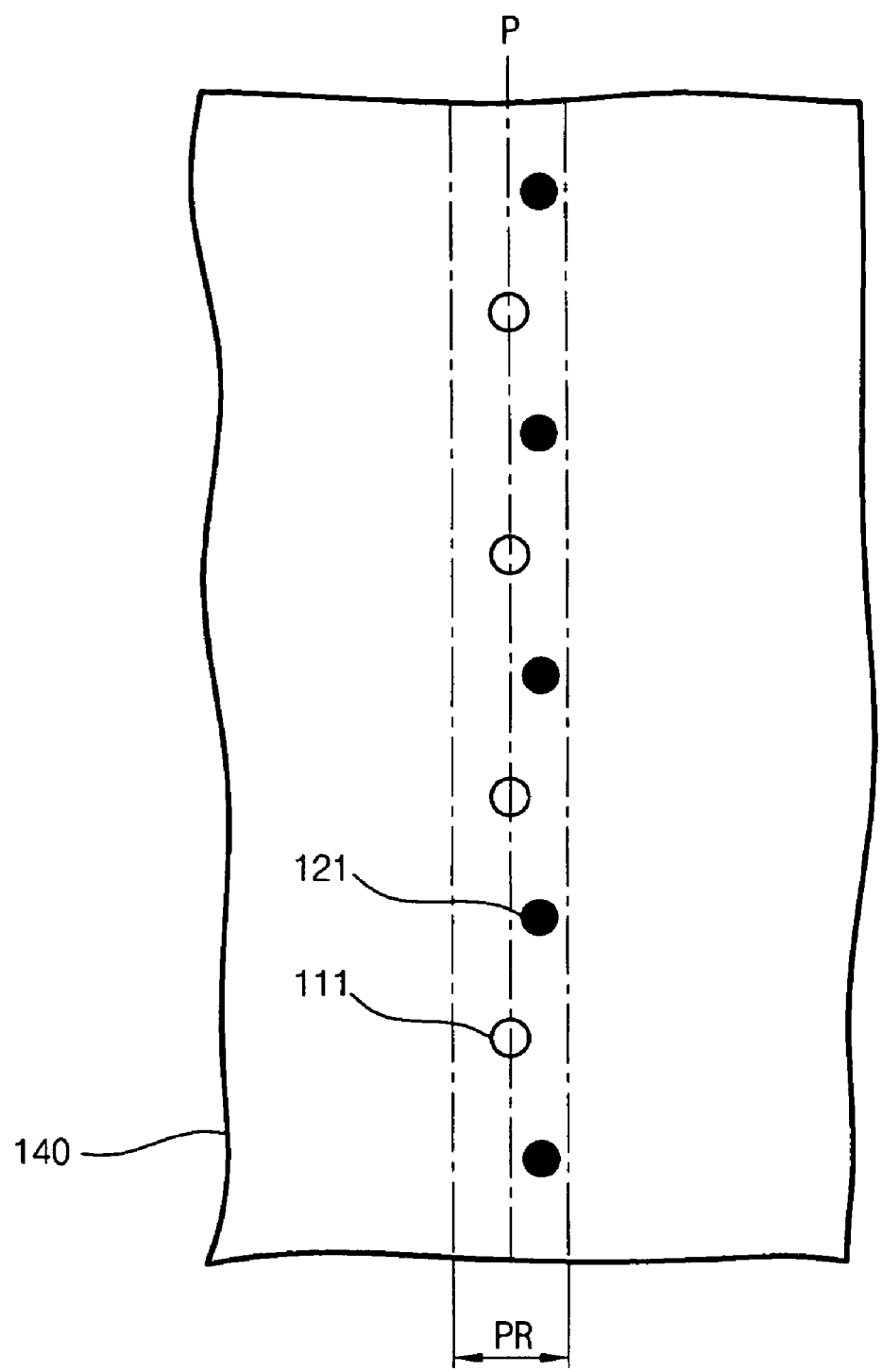
FIGS. 6A, 6B and 6C are plan views showing droplets formed by the first and second ejecting units of FIG. 5.
Figure 6B:
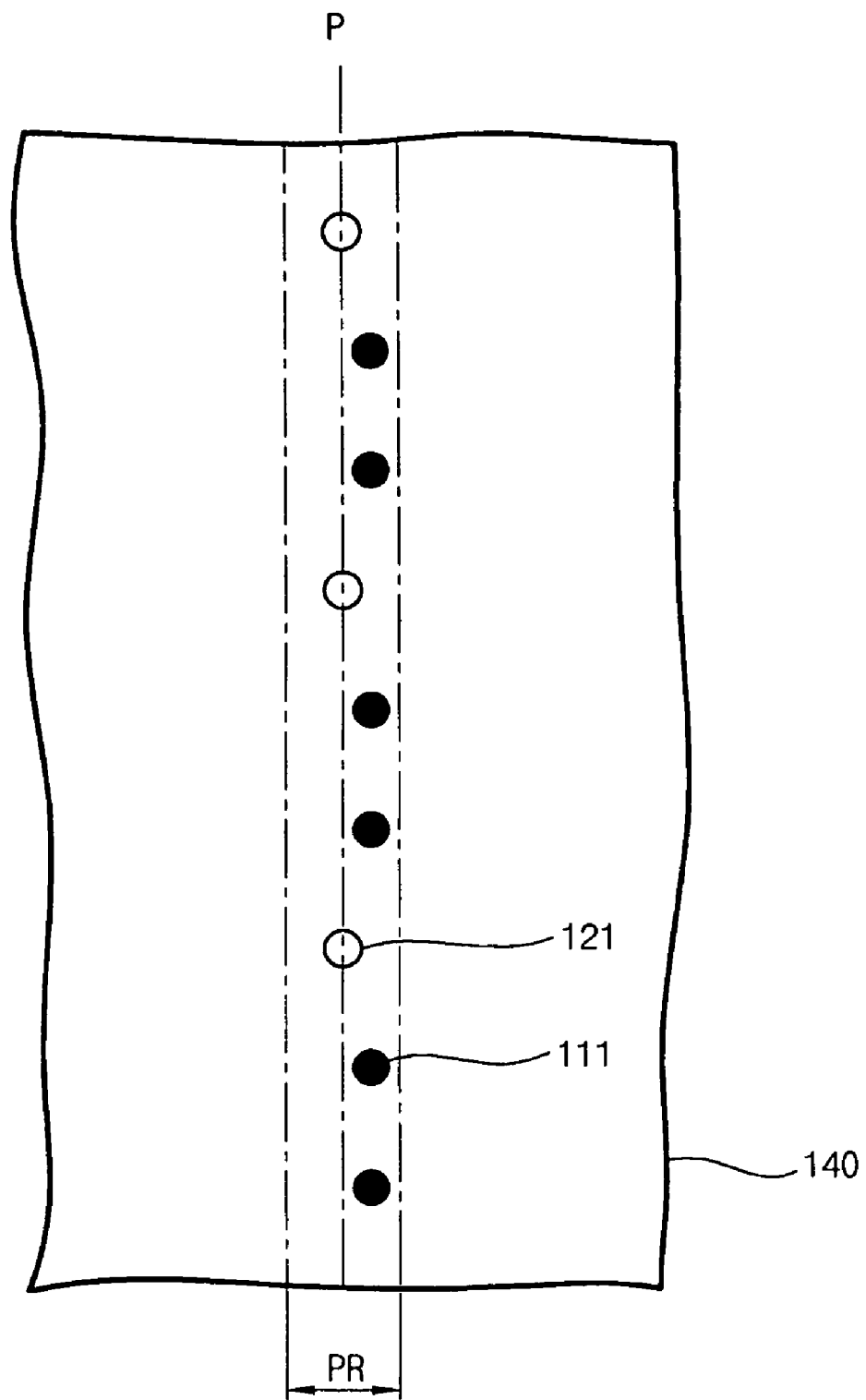
Figure 6C:
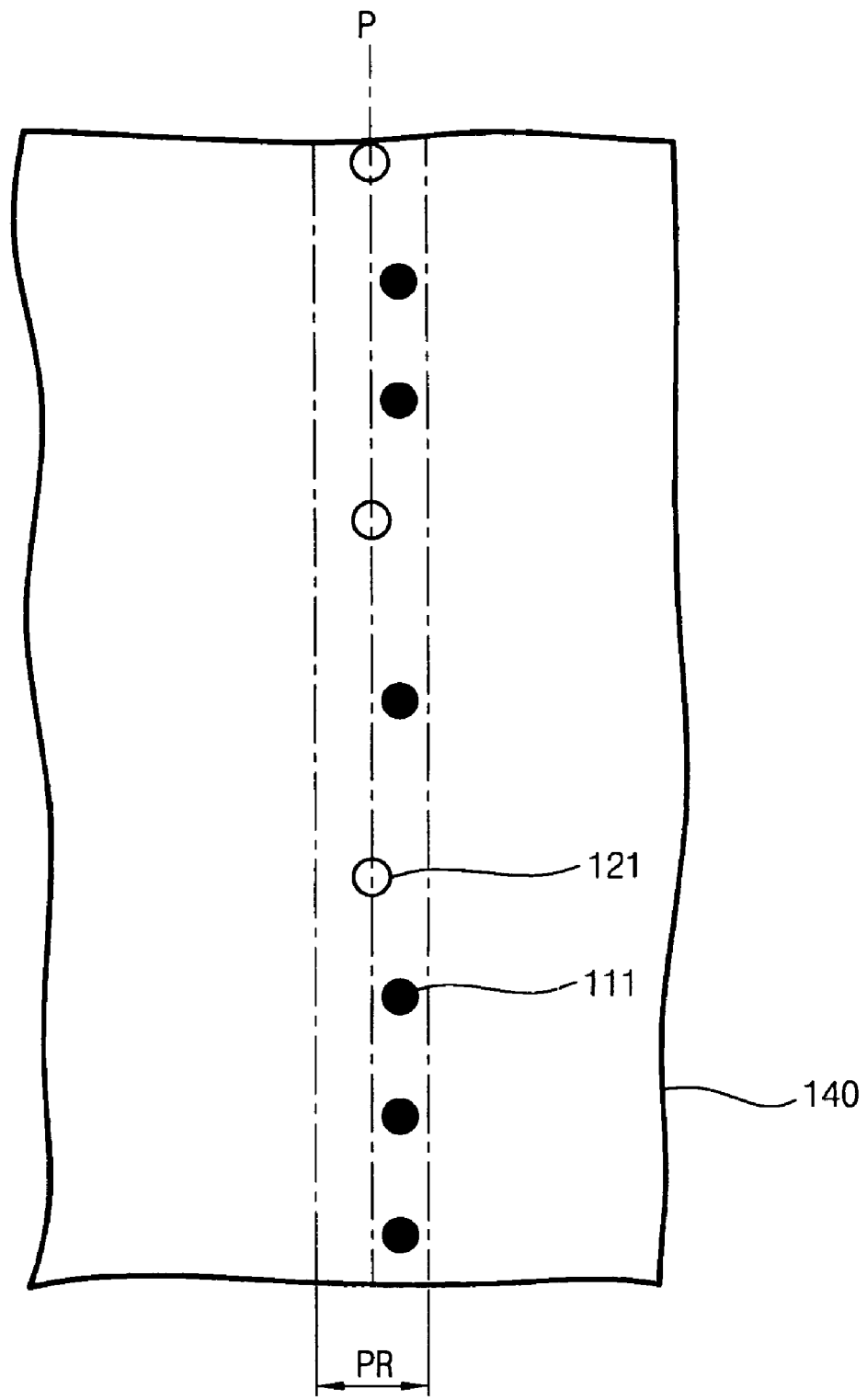

FIG. 5 is a plan view showing a first ejecting unit and a second ejecting unit according to an embodiment of the invention. FIGS. 6A, 6B and 6C are plan views showing droplets formed by the first ejecting unit and the second ejecting unit of FIG. 5.

Referring to FIG. 5, the second nozzles of the second ejecting body 123 are positioned with respect to a position of the first nozzles 112 of the first ejecting body 113. For example, as shown in FIG. 5, each of the second nozzles 122 may be provided in a path region PR along a path P defined by each of the first nozzles 112. For example, each of the second nozzles 122 may be provided along the path P or along a line that is substantially parallel with the path P. The path region PR may have a constant width; however, the path region is not limited to having such constant width.

When each of the second nozzles 122 is in the path region PR along the path P, each of the first droplets 111 ejected through each of the first nozzles 112 is disposed on the path P and each of the second droplets 121 ejected through each of the second nozzles 122 is disposed in the path region PR. For example, the first droplet may be disposed such that it is centered over the path P.

Referring to FIG. 5 and FIG. 6A, the first droplets 111 are disposed on the path P, and the second droplets 121 are disposed in the path region PR. For example, the first actuator 114 aligns the first droplets 111 ejected through each of the first nozzles 112 on the path P, and the second actuator 124 aligns the second droplets 121 ejected through each of the second nozzles 122 on the line in the path region PR, which is substantially parallel with the path P. The first and second droplets 111 and 121 may be disposed in a variety of patterns, such as, for example, alternately disposed in the path region PR.

According to another embodiment of the invention, as shown in FIG. 6B, the first actuator 114 may align the first droplets 111 ejected through each of the first nozzles 112 on the path P such that at least two of the first droplets ejected are adjacent to each other. The second actuator 124 may align the second droplets 121 ejected through each of the second nozzles 122 on the line in the path region PR such that at least two of the second droplets are adjacent to each other. The number of the first droplets 111 adjacent to each other is substantially equal to that of the second droplets 121 adjacent to each other. Further, the first droplets 111 adjacent to each other and the second droplets 121 adjacent to each other may be alternately disposed in the path region PR.

According to another embodiment of the invention, as shown in FIG. 5 and FIG. 6C, the first droplets 111 ejected through each of the first nozzles 112 and the second droplets 121 ejected through each of the second nozzles 122 are in the path region PR in a random order. For example, the first actuator 114 aligns the first droplets 111 on the path P. One of the first droplets 111 may be disposed between the second droplets 121, or at least two of the first droplets 121 may be disposed adjacent to each other. The second actuator 124 aligns the second droplets 121 on the line in the path region PR, which is substantially parallel with the path P. One of the second droplets 121 may be disposed between the first droplets 111, or at least two of the second droplets 121 are disposed adjacent to each other. The number of the first droplets 111 that are adjacent to each other may be different from the number of the second droplets 121 that are adjacent to each other. Further, at least one of the first droplets 111 adjacent to each other and at least one of the second droplets 121 adjacent to each other may be alternately disposed in the path region PR.

According to the embodiment of the invention shown in FIG. 5 and FIG. 6C, the droplet ejecting apparatus may alternately eject the first droplets 111 and the second droplets 121. Instead, the droplet ejecting apparatus may eject the first droplets 111 and the second droplets 121 in a random order.

Figure 7A:
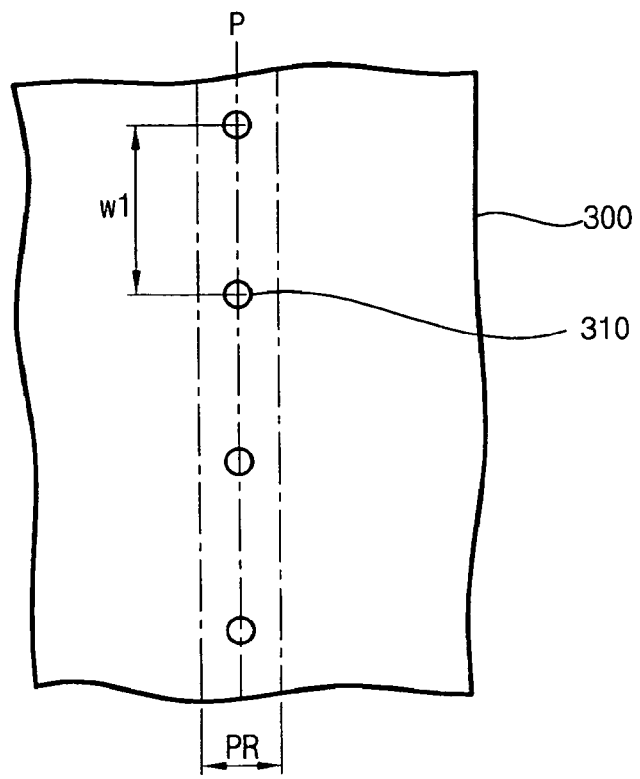
FIGS. 7A and 7B are plan views showing a method of forming droplets according to an embodiment of the invention.
Figure 7B:
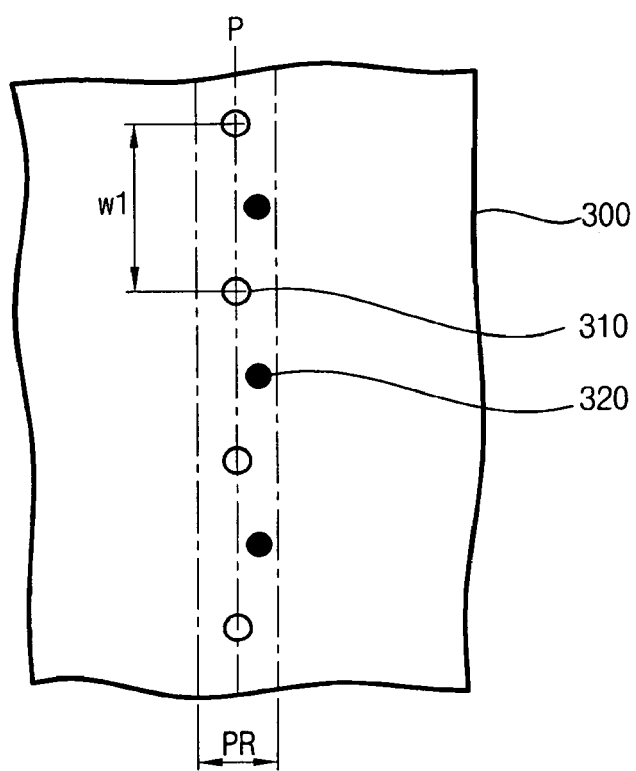

FIG. 7A and FIG. 7B are plan views showing a method of forming droplets according to an embodiment of the invention.

Referring to FIG. 7A, a path P and a path region PR adjacent to the path P are defined on a substrate 300.

First droplets 310 are disposed, e.g., dropped, on the substrate 300 along the path P. The first droplets 310 adjacent to each other are spaced apart at a first distance W1 from each other. The substrate 300 may include a plurality of paths.

The first droplets 310 may include a material for forming a color filter, a material for forming a positive charge injection layer, a material for forming a negative charge injection layer, a material for forming a light emitting layer, and the like.

When the first droplets 310 are dropped or disposed on the substrate 300 second droplets 320 are dropped or disposed on the substrate 300 after the first droplets 310 are dropped or disposed on the substrate 300.

Referring to FIG. 7B, the second droplets 320 are disposed on the substrate 300 adjacent to the first droplets 310. The second droplets 320 may be disposed along a line in the path region PR, which is substantially parallel with the path P. Alternatively, the second droplets 320 may be disposed along the path P.

The second droplets 320 may be disposed between the first droplets 320 such that the first droplets 310 and the second droplets 320 are alternately arranged in the path region PR.

Similar to the first droplets 310, the second droplets 320 may include the material for forming the color filter, the material for forming the positive charge injection layer, the material for forming the negative charge injection layer, the material for forming the light emitting layer, and the like.

The first droplets 310 may be formed of substantially the same material as the second droplets 320.

Figure 8A:
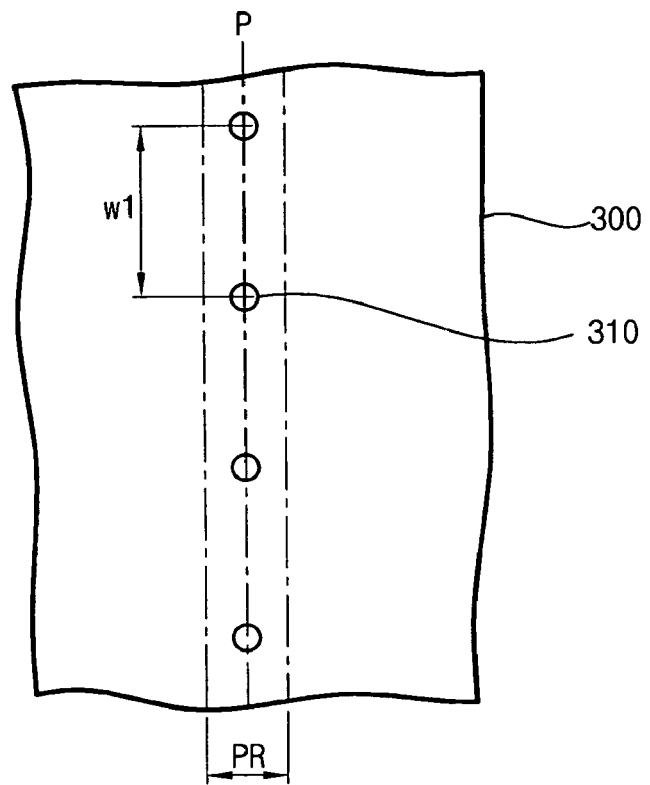
FIGS. 8A and 8B are plan views showing a method of forming droplets according to an embodiment of the inventions.
Figure 8B:
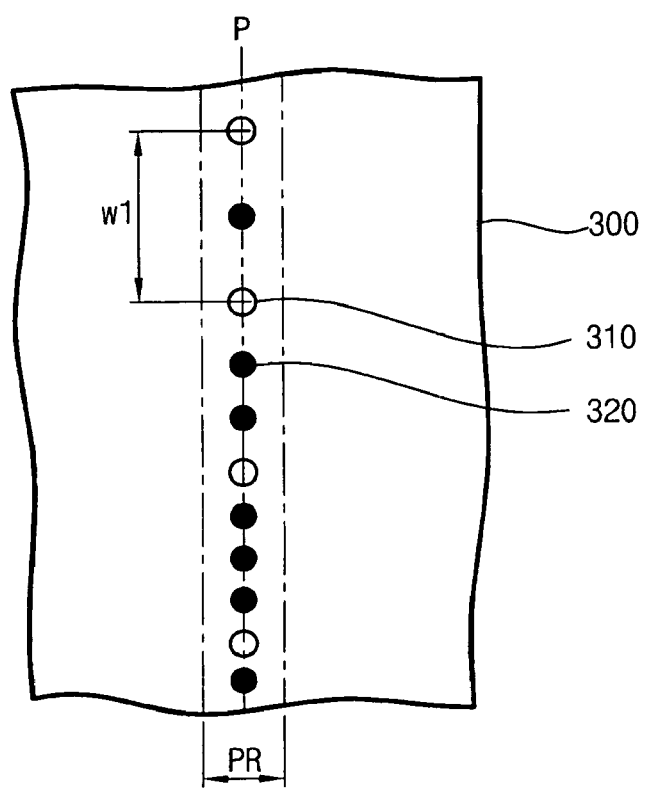

FIG. 8A and FIG. 8B are plan views showing another method of forming droplets according to an embodiment of the invention. The method of FIG. 8A and FIG. 8B is the same as the method discussed above if FIG. 7A and FIG. 7B, except the number of second droplets adjacent to each other and a line along which the second droplets are aligned. Thus, the same reference numerals are used to refer to the same or similar parts as those described in above FIGS. 7A and 7B and any further explanation is omitted, as necessary.

Referring to FIG. 8A and FIG. 8B, the second droplets 320 are disposed adjacent to first droplets 310. For example, the second droplets 320 may be in a path region PR that is adjacent to a path P, which is defined by the first droplets 310. As shown in FIG. 8A and FIG. 8B, the second droplets 320 are disposed on the path P.

The second droplets 320 may be disposed between two first droplets 310 disposed adjacent to each other. That is, an interval or space between the two first droplets 310 disposed adjacent to each other may be different from an interval or space between two second droplets 320 disposed adjacent to each other.

The first droplets 310 and the second droplets 320 may be disposed on the path P in a consistent order or a random order to make uniform a quality of the thin film patterns (hereinafter referred to as "thin films") formed from the first droplets 310 and the second droplets 320 by drying the first droplets 310 and the second droplets 320.

Figure 9:
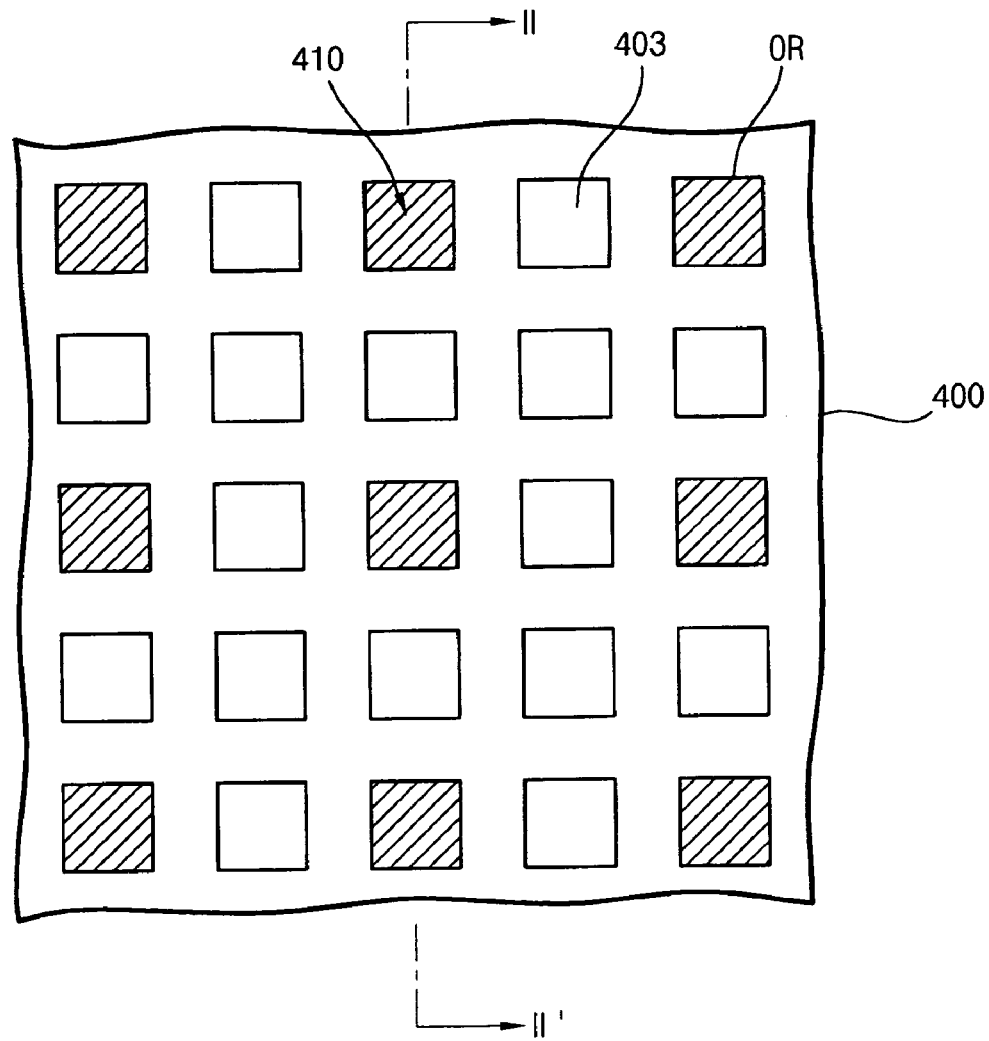
FIG. 9 is a plan view showing first droplets formed on a substrate according to an embodiment of the inventions.
Figure 10:
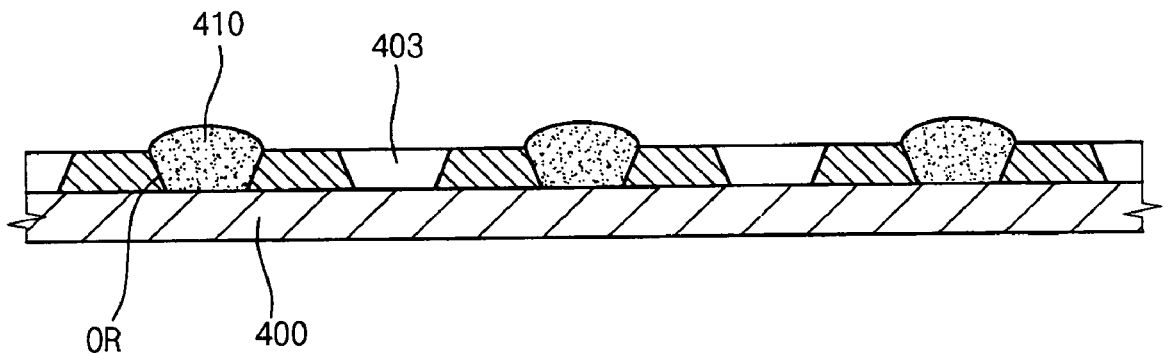
FIG. 10 is a cross-sectional view taken along a line II-II' shown in FIG. 9.

FIG. 9 is a plan view showing first droplets formed on a substrate according to an embodiment of the present invention. FIG. 10 is a cross-sectional view taken along a line II-II' shown in FIG. 9. A droplet ejecting apparatus of FIG. 9 and FIG. 10 is the same as is used in FIGS. 1, 2 and 3. Thus, the same reference numerals are used to refer to the same or similar parts as those described in FIGS. 1, 2, and 3 and any further explanation is omitted as necessary.

Referring to FIGS. 1, 9 and 10, a plurality of recesses 403 are formed on a substrate 400 in a matrix or array shape. A black inorganic thin film may be patterned to form the recesses 403 may be formed by patterning a black inorganic thin film. Alternatively, the recesses 403 may be formed by patterning a photoresist film containing a black organic material.

A first ejecting unit 110 of the droplet ejecting apparatus 100 may be aligned along odd numbered columns of the recesses 403. Accordingly, first nozzles 112 of the first ejecting unit 110 eject first droplets 410 on odd numbered recesses OR. In this exemplary embodiment, a volume of each of the first droplets 410 is no less than that of each of the recesses 403. It is understood that the first ejecting unit 110 may instead be aligned along even numbered columns of the recesses 403.

Figure 11:
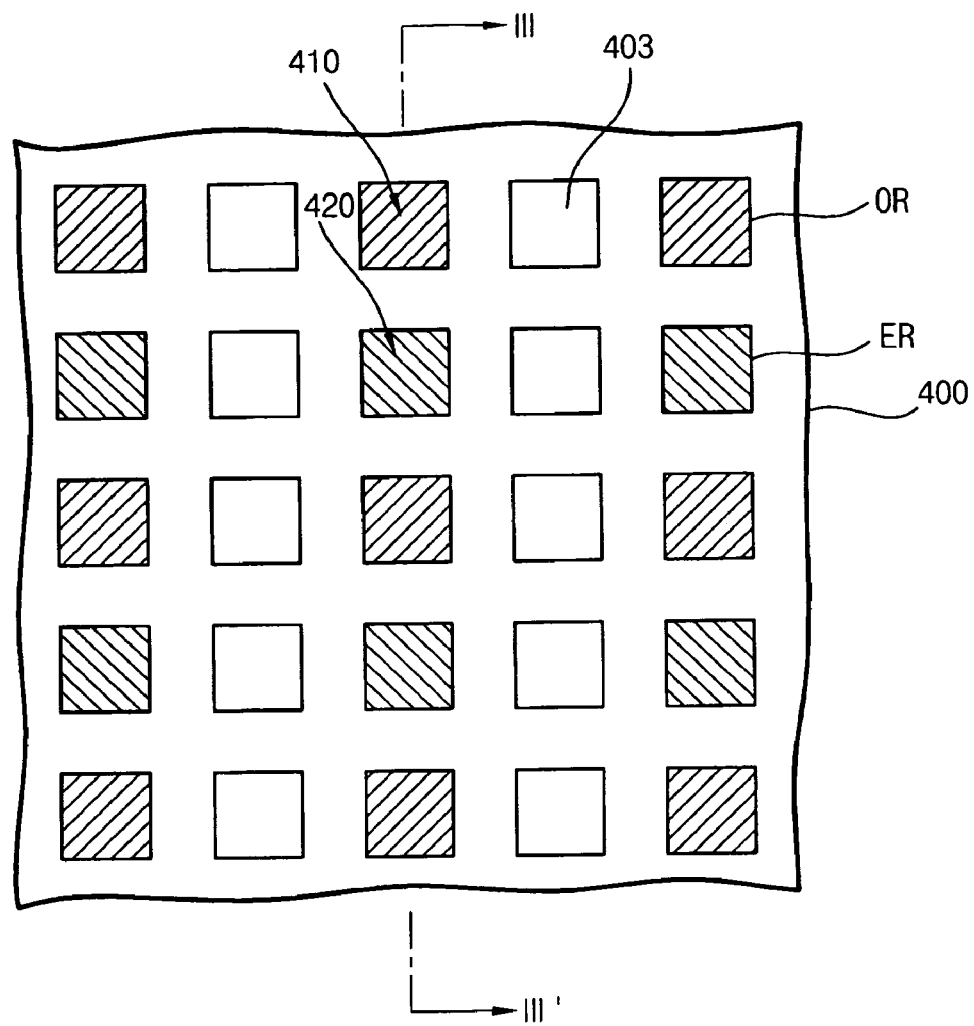
FIG. 11 is a plan view showing second droplets formed on the substrate shown in FIG. 9.
Figure 12:
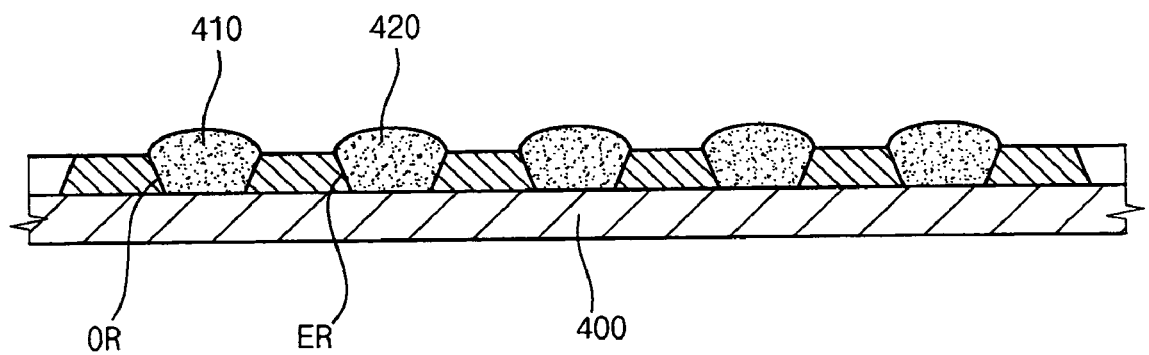
FIG. 12 is a cross-sectional view taken along a line III-III' shown in FIG. 11.

FIG. 11 is a plan view showing second droplets formed on the substrate shown in FIG. 9. FIG. 12 is a cross-sectional view taken along a line III-III' shown in FIG. 11.

Referring to FIGS. 1, 11 and 12, the droplet ejecting apparatus 100 ejects second droplets 420 on even numbered recesses ER of the odd numbered columns through second nozzles 122 of the second ejecting unit 120. Therefore, both the first droplets 410 and the second droplets 420 are ejected on the recesses 403 of the odd numbered columns.

The first droplets 410 and the second droplets 420 are formed of substantially the same material.

The droplet ejecting apparatus 100 then ejects the first droplet 410 and the second droplets 420 on recesses 403 of even numbered columns so that the first and second droplets 410 and 420 are disposed on all of the entire of the recesses 403.

Figure 13:
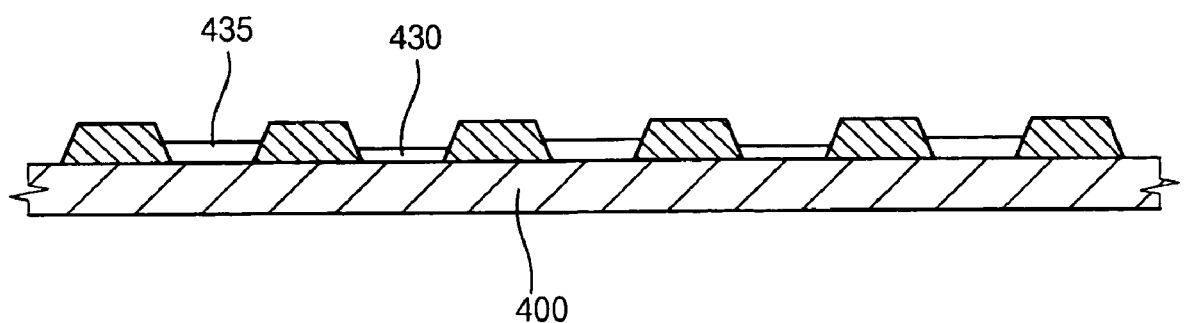
FIG. 13 is a cross-sectional view showing dried first droplets and second droplets shown in FIG. 12.

FIG. 13 is a cross-sectional view showing dried first and second droplets shown in FIG. 12.

Referring to FIGS. 1, 12 and 13, the first droplets 410 in the odd numbered recesses OR of the recesses 403 are dried to form first thin films 435, and the second droplets 420 in the odd numbered recesses OR of the recesses 403 are dried for a sufficient period of time and form second thin films 430.

Each of the first and second thin films 435 and 430 may be a red color filter, a green color filter, or a blue color filter. Alternatively, each of the first thin films 435 and the second thin films 430 may be a positive charge carrier injecting layer, a negative charge carrier injecting layer, a light emitting layer, and the like.

The first droplets 410 that form the first thin films 435 may have different volumes from one another. A thickness of the first thin films 435 and the second thin films 430 charges according to the volume of the first droplets 410 and the second droplets, respectively.

The first thin film 435 and the second thin films 430, which may have different thicknesses, are aligned in either a consistent order or in a random order so that lights generated from the first thin film 435 and the second thin films 430 are combined, thereby improving an image display quality of the display device.

Figure 14:
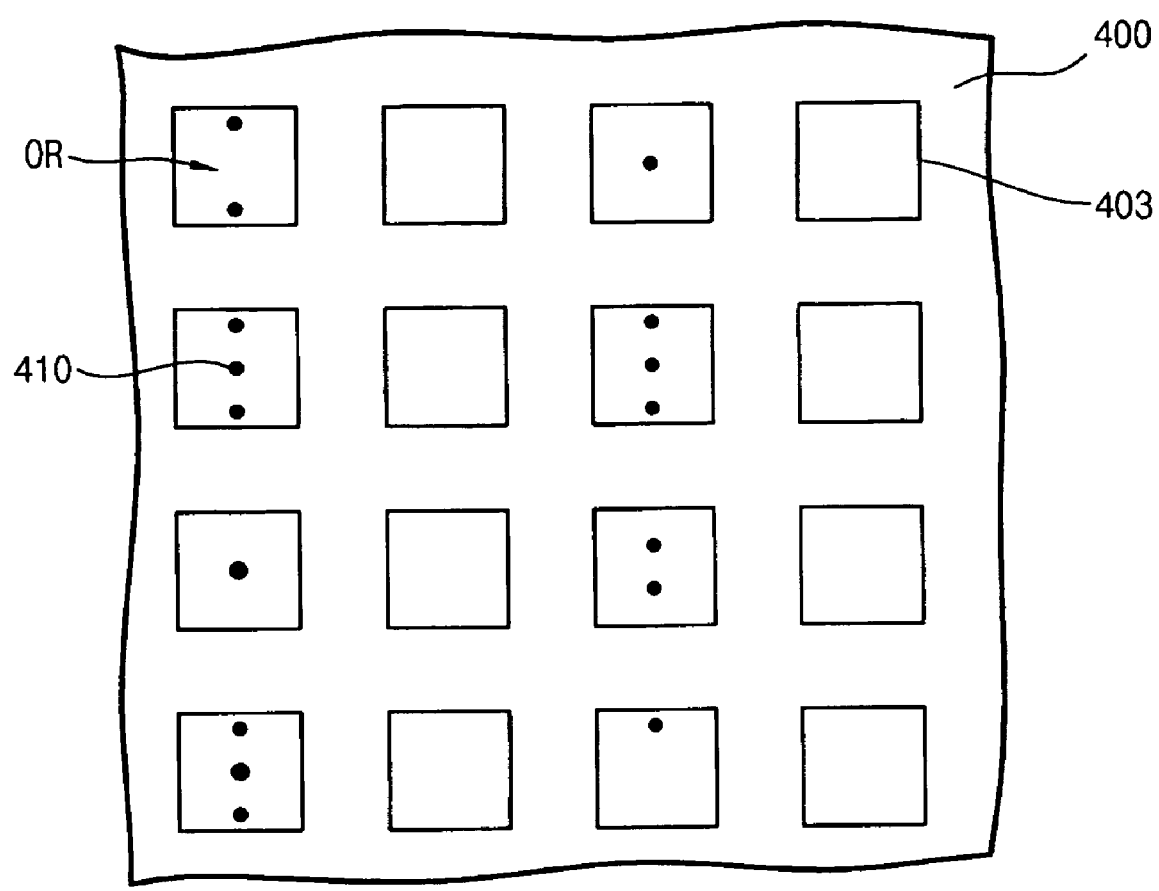
FIG. 14 is a plan view showing first droplets formed on a substrate according to an embodiment of the inventions.

FIG. 14 is a plan view showing first droplets formed on a substrate in according is to another embodiment of the invention. A droplet ejecting apparatus of FIG. 14 is the same as the droplet ejecting apparatus used in FIGS. 1, 2 and 3. Thus, the same reference numerals are used to refer to the same or similar parts as those described in FIGS. 1, 2 and 3 and any further explanation is omitted, as necessary.

Referring to FIGS. 1 and 14, a plurality of recesses 403 are arranged on a substrate 400 in a matrix or array shape. The recesses 403 may be formed by patterning, black inorganic thin film. Alternatively, the recesses 403 may be formed by patterning black organic material having photoresist.

A first ejecting unit 110 of the droplet ejecting apparatus 100 is aligned along recesses 403 on odd numbered columns. First nozzles 112 of the first ejecting unit 110 eject a first droplet 410 on the recesses 403 of the odd numbered columns. The number of the first droplets 410 disposed on each of the recesses 403 of the odd numbered columns may be random. Alternatively, the number of the first droplets 410 disposed on each of the recesses 403 of the odd numbered columns may be constant or a predetermined amount.

Figure 15:
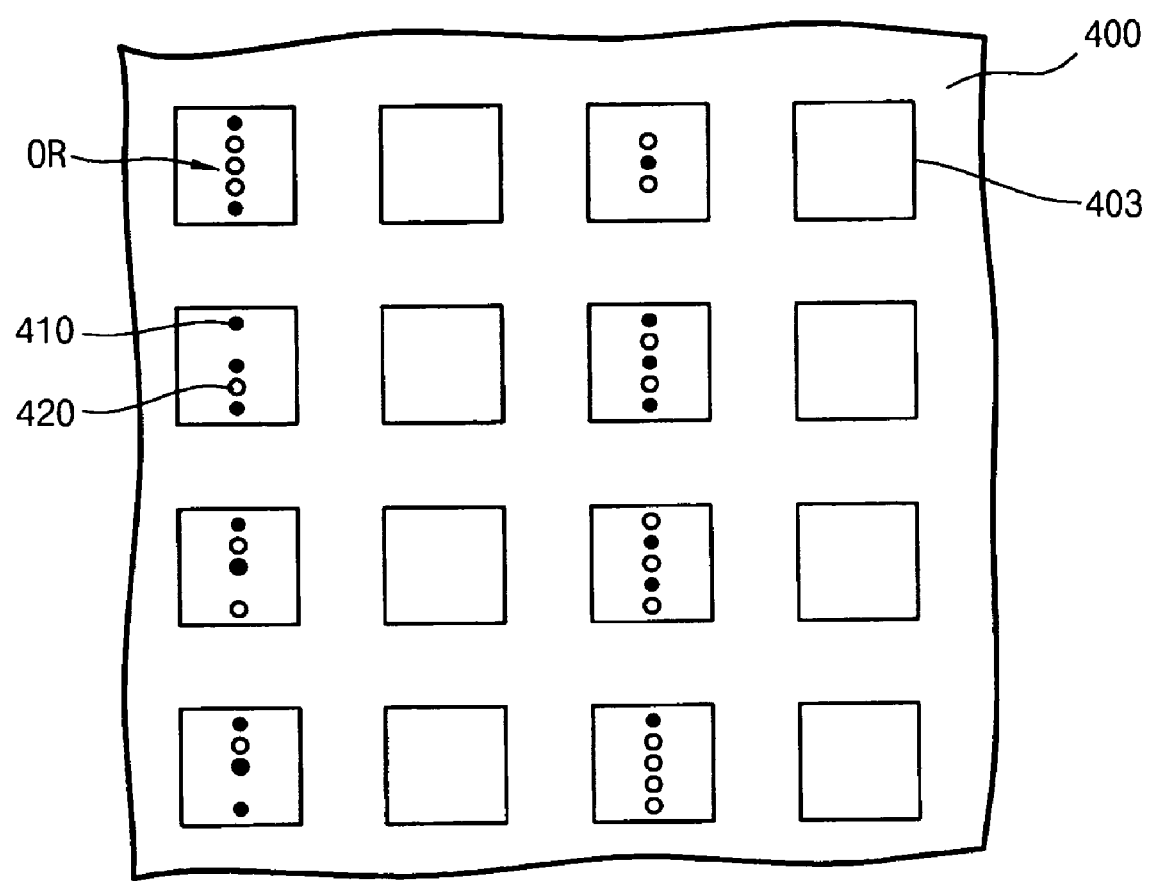
FIG. 15 is a plan view showing second droplets formed on the substrate shown in FIG. 14.

FIG. 15 is a plan view showing second droplets disposed on the substrate shown in FIG. 14.

Referring to FIGS. 1 and 15, the droplet ejecting apparatus 100 ejects second droplets 420 on the recesses 403 of the odd numbered columns through second nozzles 122 of the second ejecting unit 120. The second droplets 420 may be adjacent to the first droplets 420, and the second droplets 420 may also be disposed between the first droplets 420 adjacent to each other. Therefore, the first droplets 410 and the second droplets 420 are ejected on each of the recesses 403 of the odd numbered columns.

The first droplets 410 and the second droplets 420 are formed of substantially the same material.

The droplet ejecting apparatus 100 then ejects the first droplets 410 and the second droplets 420 on the recesses 403 of even numbered columns so that the first droplets 410 and the second droplets 420 are disposed on all of the recesses 403.

The first droplets 410 and the second droplets 420 disposed in the recesses 403 are dried for a sufficient period of time to form thin films 430.

The thin films 430 may be a red color filter, a green color filter, or a blue color filter. Alternatively, each of the thin films 430 may be a positive charge carrier injecting layer, a negative charge carrier injecting layer, a light emitting layer, and the like.

The first droplets 410 that form the first thin films 435 may have different volumes from one another. Likewise, the second droplets 420 that form the second thin films of 430 may have different volumes from one another. A thickness of the first thin films 435 and the second thin films 430 charges according to the volume of the first droplets 410 and the second droplets, respectively. The first droplets 410 and the second droplets 420 are combined on each of the recesses 403 so that the thin films 430 may have a constant thickness, e.g., level.

Figure 16:
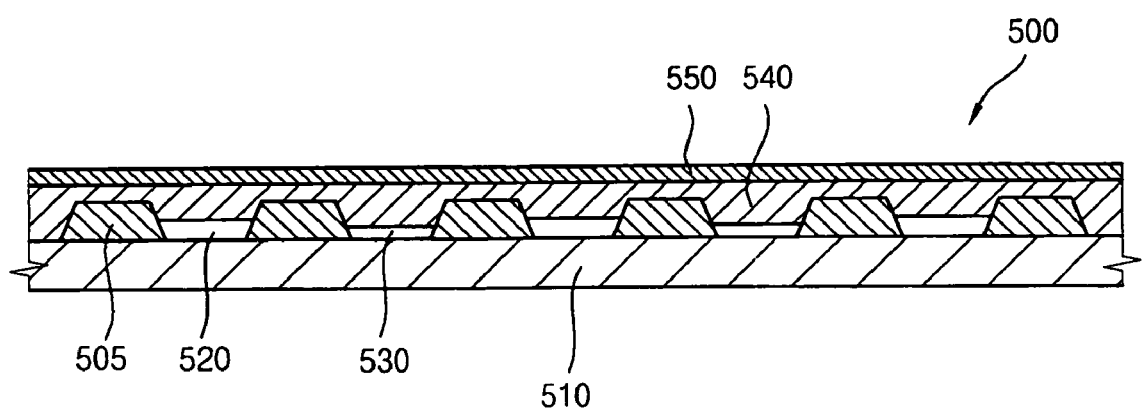
FIG. 16 is a cross-sectional view showing a substrate for a display device according to an embodiment of the invention.

FIG. 16 is a cross-sectional view showing a substrate for a display device according to an embodiment of the invention.

Referring to FIG. 16, the substrate 500 may be a color filter substrate for a liquid crystal display (LCD) device.

The substrate 500 includes a transparent plate 510, first pixel thin films 520 and second pixel thin films 530. The substrate 500 may further include an over-coating layer 540 and a common electrode 550.

A plurality of pixel regions are defined on the transparent plate 510 by a black matrix 505, which is provided on the transparent plate 510. A peripheral region surrounding the pixel regions may also be defined on the transparent plate 510.

A thin film, such as an oxide chromium thin film, a chromium thin film, a black organic layer, and the like, is patterned to form the black matrix 505.

The first pixel thin films 520 have a first thickness and are provided on odd numbered pixel regions of odd numbered columns. The second pixel thin films 530 have a second thickness provided on even numbered pixel regions of the odd numbered columns. The second thickness may be different from the first thickness. For example, in the embodiment shown in FIG. 16, the first thickness is greater than the second thickness.

The first pixel thin films 520 and second pixel thin films 530 may each be a red color filter, a green color filter, or a blue color filter.

The first pixel thin films 520 and the second pixel thin films 530 may each be thinner than the black matrix 505. When each of the first pixel thin films 520 and the second pixel thin films 530 is thinner than the black matrix 505, the over-coating layer 540 is formed on the transparent plate 510 to planarize an upper surface of the transparent plate 510 pixel.

The common electrode 550 may be on the over-coating layer 540. The common electrode 550 may include a transparent conductive material such as indium zinc oxide (IZO), indium tin oxide (ITO), amorphous indium tin oxide (a-ITO), and the like.

Figure 17:
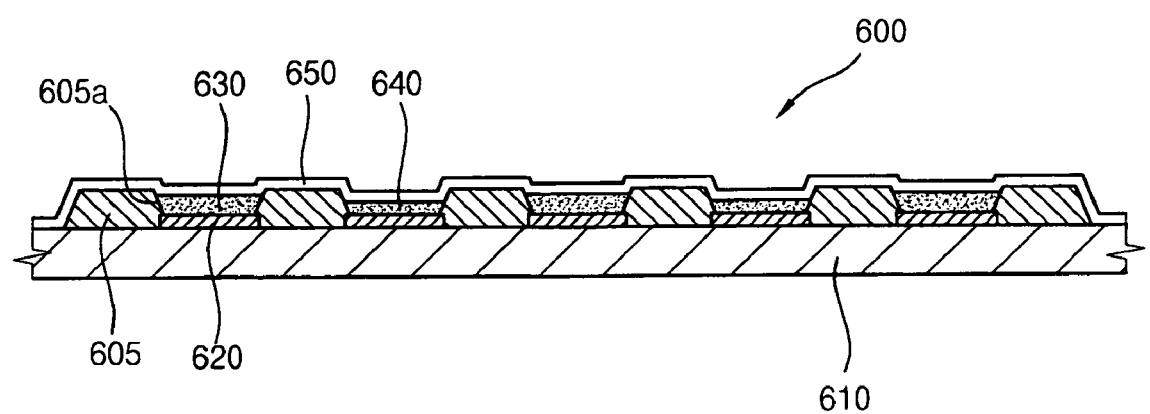
FIG. 17 is a cross-sectional view showing a substrate for a display device according to an embodiment of the invention.

FIG. 17 is a cross-sectional view showing a substrate for a display device according to another embodiment of the invention.

Referring to FIG. 17, the substrate 600 includes a transparent plate 610, first electrodes 620, an organic pattern 605 having recesses 605a, first pixel thin films 630, second pixel thin films 640 and a second electrode 650 coupled with the pixel thin films 630. The first pixel thin film 630 and the second pixel thin film 640 contact the first electrodes 620

Each of the first electrodes 620 formed on the transparent plate 610 includes a transparent conductive material, such as IZO, ITO, etc. The first electrodes 620 are arranged on the transparent plate 610 in a matrix or array shape.

The organic pattern 605 or an inorganic pattern (not shown) is provided on the transparent plate 610. The organic pattern 605 includes the recesses 605a through which the first electrodes 620 are exposed. The recesses 605a are arranged on the transparent plate 610 in a matrix or array shape.

The first pixel thin films 630 having a first thickness are provided on odd numbered recesses 605a of odd numbered columns. The second pixel thin films 640 having a second thickness are provided on even numbered recesses 605a of the odd numbered columns. The second thickness may be different from the first thickness. For example, the first thickness may be thinner than the second thickness.

According to the embodiment of the invention shown in FIG. 17, each of the first and second pixel thin films 630 and 640 may include a positive charge carrier injecting layer, a light emitting layer, a negative charge carrier injecting layer, etc. The light emitting layer may be positioned between the positive charge carrier injecting layer and the negative charge carrier injecting layer.

The second electrode 650 is provided on the transparent plate 610 having the first electrodes 620, the organic pattern 605, the first pixel thin film 630, and the second pixel thin film 640. The second electrode 650 is coupled with the first pixel thin film 630 and the second pixel thin films 640.

According to an embodiment of the invention, droplets from different nozzles are is formed in each of the columns to improve the image display quality of the display device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents

What is claimed is:

1. A method of dropping a droplet on a substrate, comprising:
disposing first droplets from a first ejecting unit on the substrate only along a first path defined along a scanning direction; and
disposing second droplets from a second ejecting unit, which is independent from the first ejecting unit, only along a second path different from the first path in a path region of the substrate,
wherein
the first droplets and the second droplets are formed of substantially the same material;
the path region extends a predetermined distance in a direction substantially perpendicular to the scanning direction from the path;
each of the second droplets is disposed between the first droplets in the scanning direction, and
the first path and the second path are parallel with the scanning direction.

2. A method of dropping a droplet on a substrate, comprising:
disposing first droplets from a first ejecting unit on the substrate along a first path defined along a scanning direction; and
disposing second droplets from a second ejecting unit, which is independent from the first ejecting unit, along a second path in a path region of the substrate,
wherein the first droplets and the second droplets are formed of substantially the same material;
wherein the path region extends a predetermined distance in a direction substantially perpendicular to the scanning direction from the path;
wherein each of the second droplets is disposed between the first droplets in the scanning direction,
wherein the second droplets are disposed on the substrate along the second path in a random order, and
wherein the first path and the second path are parallel with the scanning direction.

3. The method of claim 1, further comprising:
arranging the first droplets and the second droplets in a consistent order on the substrate.

4. The method of claim 3, further comprising:
arranging the first droplets and the second droplets in an alternative order on the substrate.

5. The method of claim 1, further comprising:
arranging the first droplets and the second droplets in a random order on the substrate.

6. A method of forming a thin film on a substrate including a plurality of recess, the method comprising:
disposing first droplets from a first ejecting unit only along a first path defined along a scanning direction on a portion of the plurality of recesses that are arranged substantially parallel with one another on the substrate;
disposing second droplets from a second ejecting unit, which is independent from the first ejecting unit, only along a second path different from the first path, on another portion of the plurality of recesses; and
drying the first droplets and the second droplets to form thin films,
wherein the first droplets and the second droplets are formed of substantially the same material;
each of the second droplets is disposed between the first droplets along the scanning direction in a path region, and the path region extends a predetermined distance in a direction substantially perpendicular to the scanning direction from the path, and
the first path and the second path are parallel with the scanning direction.

7. The method of claim 6, further comprising:
forming a black matrix on the substrate to define the recesses.

8. The method of claim 6, wherein each of the thin films is a red color filter, a green color filter, or a blue color filter.

9. The method of claim 6, further comprising:
forming an organic pattern on the substrate to define the recesses.

10. The method of claim 6, further comprising:
forming an inorganic pattern on the substrate to define the recesses.

11. The method of claim 10, wherein each of the thin films is a negative charge carrier injecting layer, a positive charge carrier injecting layer, or a light emitting layer.

12. A method of forming a thin film on a substrate, comprising:
disposing a first droplet from a first ejecting unit only along a first path defined along a scanning direction on each of a plurality of recesses which are arranged substantially parallel with one another on the substrate;
disposing a second droplet from a second ejecting unit, independent from the first ejecting unit, only along a second path different from the first path on each of the plurality of recesses; and
drying the first and second droplets to form thin films on the plurality of recesses of the substrate,
wherein the first droplets and the second droplets are formed of substantially the same material;
each of the second droplets is disposed between the first droplets along the scanning direction in a path region, and the path region extends a predetermined distance in a direction substantially perpendicular to the scanning direction from the path, and
the first path and the second path are parallel with the scanning direction.

13. The method of claim 12, further comprising:
arranging the first droplets and the second droplets in a consistent order in the recesses.

14. The method of claim 12, further comprising:
arranging the first droplets and the second droplets in an alternative order in the recesses.

15. The method of claim 12, further comprising:
arranging the first droplets and the second droplets in a random order in the recesses.

* * * * *